United States Patent
Yuan (10) Patent No.: US 9,880,426 B2
(45) Date of Patent: Jan. 30, 2018

(54) DISPLAY PANEL AND MANUFACTURING METHOD THEREOF, MASK AND MANUFACTURING METHOD THEREOF, AND DISPLAY DEVICE

(71) Applicants: HEFEI BOE OPTOELECTRONICS TECHNOLOGY CO., LTD., Hefei, Anhui (CN); BOE TECHNOLOGY GROUP CO., LTD., Beijing (CN)

(72) Inventor: Huifang Yuan, Beijing (CN)

(73) Assignees: HEFEI BOE OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 179 days.

(21) Appl. No.: 14/348,738

(22) PCT Filed: Jun. 26, 2013

(86) PCT No.: PCT/CN2013/078052
§ 371 (c)(1),
(2) Date: Mar. 31, 2014

(87) PCT Pub. No.: WO2014/139238
PCT Pub. Date: Sep. 18, 2014

(65) Prior Publication Data
US 2015/0219951 A1    Aug. 6, 2015

(30) Foreign Application Priority Data

Mar. 15, 2013    (CN) .......................... 2013 1 0083869

(51) Int. Cl.
*G02F 1/1339*    (2006.01)
*G02F 1/1335*    (2006.01)
(Continued)

(52) U.S. Cl.
CPC .... *G02F 1/13394* (2013.01); *G02F 1/133514* (2013.01); *G03F 1/00* (2013.01);
(Continued)

(58) Field of Classification Search
CPC .................. G02F 1/13394; G02F 2001/13396
See application file for complete search history.

(56) References Cited

U.S. PATENT DOCUMENTS

2002/0039692 A1*  4/2002  Tanaka ...................... G03F 1/32
                                                                  430/5
2002/0140893 A1* 10/2002  Yi ........................ G02F 1/13394
                                                                349/155
(Continued)

FOREIGN PATENT DOCUMENTS

| CN | 101806974 A | 8/2010 |
| CN | 102213857 A | 10/2011 |
| CN | 102955297 A | 3/2013 |
| JP | 2009-216996 A | 9/2009 |

OTHER PUBLICATIONS

Second Chinese Office Action Appln. No. 201310083869.2; dated Jun. 30, 2015.
(Continued)

*Primary Examiner* — Phu Vu
(74) *Attorney, Agent, or Firm* — Ladas & Parry LLP; Loren K. Thompson (57) ABSTRACT

A display panel and a manufacturing method thereof, a mask and a manufacturing method thereof, and a display device. The display panel includes a first display substrate and a second display substrate arranged to be opposed to each other, and main spacers and assistant spacers arranged between the first display substrate and the second display substrate. The main spacers and the assistant spacers are both arranged on the first display substrate. The main spacers have a height equal to a distance from the first (Continued)

display substrate to the second display substrate to support the first display substrate and the second display substrate. The assistant spacers have a height smaller than that of the main spacers. An end surface of a suspending end of at least one of the assistant spacers is planar and/or an end surface of a suspending end of at least one of the assistant spacers is convex.

9 Claims, 6 Drawing Sheets

(51) Int. Cl.
    *G03F 1/32*     (2012.01)
    *G03F 1/76*     (2012.01)
    *G03F 1/80*     (2012.01)
    *G03F 1/00*     (2012.01)

(52) U.S. Cl.
    CPC .................. *G03F 1/32* (2013.01); *G03F 1/76* (2013.01); *G03F 1/80* (2013.01); *G02F 2001/13396* (2013.01); *G02F 2201/503* (2013.01)

(56) References Cited

U.S. PATENT DOCUMENTS

| | | | |
|---|---|---|---|
| 2006/0099521 A1* | 5/2006 | Park | G03F 1/50 430/5 |
| 2011/0156039 A1* | 6/2011 | Baek | G02F 1/13394 257/59 |
| 2012/0086901 A1* | 4/2012 | Nakagawa | G02F 1/13394 349/155 |
| 2013/0050619 A1* | 2/2013 | Kim | G02F 1/13394 349/106 |
| 2014/0071391 A1* | 3/2014 | Yang | G02F 1/133371 349/138 |

OTHER PUBLICATIONS

First Chinese Office Action dated Feb. 9, 2015, Appln. No. 201310083869.2.
International Search Report dated Dec. 19, 2013; PCT/CN2013/078052.
International Preliminary Report on Patentability Appln. No. PCT/CN2013/078052; dated Sep. 15, 2015.

* cited by examiner

DISPLAY PANEL AND MANUFACTURING METHOD THEREOF, MASK AND MANUFACTURING METHOD THEREOF, AND DISPLAY DEVICE

FIELD OF THE INVENTION

Embodiments of the present invention relate to a display panel and a manufacturing method thereof, a mask and a manufacturing method thereof, and a display device.

BACKGROUND

In the current display technology industry, a display panel is formed by cell-assembling a first display substrate and a second display substrate. At present, spacers are generally provided between the first display substrate and the second display substrate in order to maintain the cell thickness therebetween.

Figure 1:
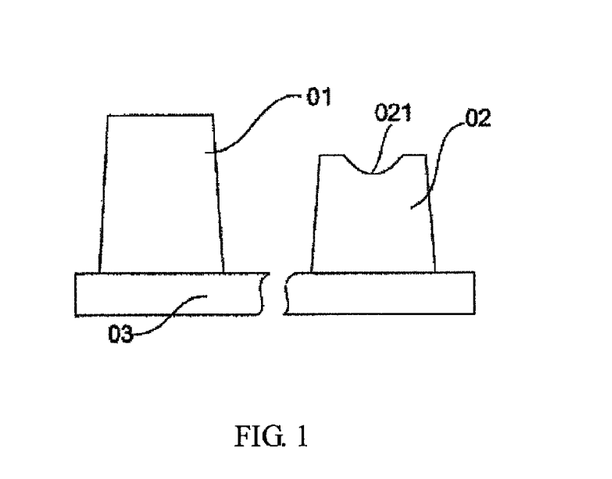
FIG. 1 is a structure schematic view of a main spacer and an assistant spacer on a color filter substrate in prior art.

As an example, a main spacer and an assistant spacer in a liquid crystal display panel comprising a color filter substrate and an array substrate arranged to be opposed to each other are both provided on the color filter substrate, as illustrated in FIG. 1. Spacers on a transparent substrate 03 of the color filter substrate are divided into a main spacer 01 and an assistant spacer 02, wherein the main spacer 01 is high, the assistant spacer 02 is low, and the level difference between the main spacer 01 and the assistant spacer 02 is required to be around 0.6 μm. The level difference between the main spacer 01 and the assistant spacer 02 can be realized during the manufacturing process thereof by using a half-tone mask.

In the actual production, the inventor has analyzed and found that a central region of an end surface of a suspending end of the assistant spacer 02 prepared in the color filter substrate has a recess 021, and presents a basin topography with concave shape. The stability of the assistant spacer 02 of the color filter substrate in the prior art for supporting the array substrate is poor, and thus the product performance is reduced.

SUMMARY

Embodiment of the present invention provides a display panel comprising a first display substrate and a second display substrate arranged to be opposed to each other, and main spacers and assistant spacers arranged between the first display substrate and the second display substrate, wherein, the main spacers and the assistant spacers are both arranged on the first display substrate;

each of the main spacers has a height equal to a distance from the first display substrate to the second display substrate to support the first display substrate and the second display substrate, and each of the assistant spacers has a height smaller than the height of the main spacers; and an end surface of a suspending end of at least one of the assistant spacers is a planar surface, and/or an end surface of a suspending end of at least one of the assistant spacers is a convex surface.

In one example, an end surface of a suspending end of at least one of the assistant spacers is a convex surface, the at least one of the assistant spacers comprises a main body and a suspending convex part, and a surface of the suspending convex part departing from the main body is a hemispherical surface.

In one example, the display panel is a liquid crystal display panel, an electronic paper or an organic light emitting display panel.

In one example, the display panel is a liquid crystal display panel, the first display substrate is a color filter substrate, and the second display substrate is an array substrate.

In one example, a material of the main spacers and the assistant spacers is a negative photoresist material.

Another embodiment of the invention provides a half-tone mask comprising non-transparent regions and half-tone transparent regions, wherein the non-transparent regions are provided with a light shielding film, the half-tone transparent regions are provided with a half-tone transparent film, and a central region of the half-tone transparent film in at least one of the half-tone transparent regions is a hollowed-out region.

In one example, the half-tone mask further comprises a transparent region without light shielding film and half-tone transparent film provided therein.

In one example, the light shielding film is a chrome film.

In one example, the half-tone mask further comprises a transparent base substrate, wherein the light shielding film and the half-tone transparent film are provided on the base substrate.

Still another embodiment of the invention provides a manufacturing method of a half-tone mask, comprising:

forming a light shielding film on a base substrate, and performing a patterning process on the light shielding film to define a non-transparent region and a half-tone transparent region, wherein the light shielding film in the non-transparent region is retained and at least a part of the light shielding film other than a central region in the half-tone transparent region is removed;

forming a half-tone transparent film on the base substrate after the above step, and forming a hollowed-out region in the central region of the half-tone transparent region by a patterning process.

In one example, the light shielding film of the half-tone transparent region is completely removed in the patterning process on the light shielding film; forming the half-tone transparent film on the base substrate after the above step, and forming the hollowed-out region in the central region of the half-tone transparent region by the patterning process comprises:

forming the half-tone transparent film on the base substrate;

applying a layer of photoresist on the half-tone transparent film;

performing an exposing and developing process such that the photoresist forms into a photoresist-removed region corresponding to the central region of the half-tone transparent region and a photoresist-retained region corresponding to the region other than the central region of the half-tone transparent region and the non-transparent region;

etching the half-tone transparent film of the central region of the half-tone transparent region;

removing the residual photoresist.

In one example, the light shielding film of the central region of the half-tone transparent region is retained in the patterning process on the light shielding film; forming the half-tone transparent film on the base substrate after the above step, and forming the hollowed-out region in the central region of the half-tone transparent region by the patterning process comprises:

forming the half-tone transparent film on the base substrate;

applying a layer of photoresist on the half-tone transparent film;

performing an exposing and developing process such that the photoresist forms into a photoresist-removed region corresponding to the central region of the half-tone transparent region with the light shielding film retained and a photoresist-retained region corresponding to the region other than the central region of the half-tone transparent region and the non-transparent region;

etching the light shielding film and the half-tone transparent film in the region being not covered with photoresist, and forming a pattern of the half-tone transparent film and a pattern of the light shielding film;

removing the residual photoresist.

In one example, the photoresist-removed region further corresponds to a transparent region, and the half-tone transparent film and the light shielding film of the transparent region are etched off.

Still another embodiment of the invention provides a manufacturing method of a display panel comprising manufacturing assistant spacers by using the half-tone mask in accordance with any embodiments as mentioned above.

Still another embodiment of the invention provides a display device comprising a display panel in accordance with any embodiments as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION OF THE PREFERRED EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In the actual production, the inventor has found that a suspending end of an assistant spacer between a first display substrate and a second display substrate is used for supporting the part of the respective display substrates only around the recess of the suspending end of the assistant spacer, while the assistant spacer supports an array substrate. The part around the recess is easily crushed when the assistant spacer is subjected to excessive pressure, resulting in the damage to the assistant spacer and accordingly reducing the support stability of the assistant spacer. Embodiments of the invention provide a display panel comprising an assistant spacer with high support stability.

First Embodiment

Figure 2A:
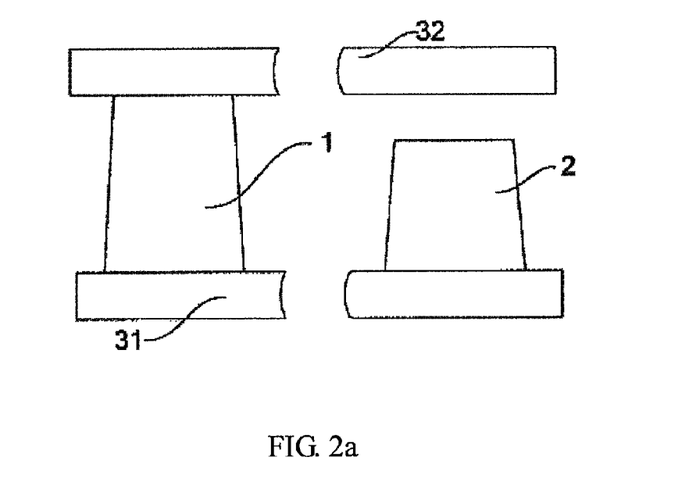
FIG. 2a is a structure schematic view of a main spacer and an assistant spacer in a display panel provided by an embodiment of the invention.
Figure 2B:
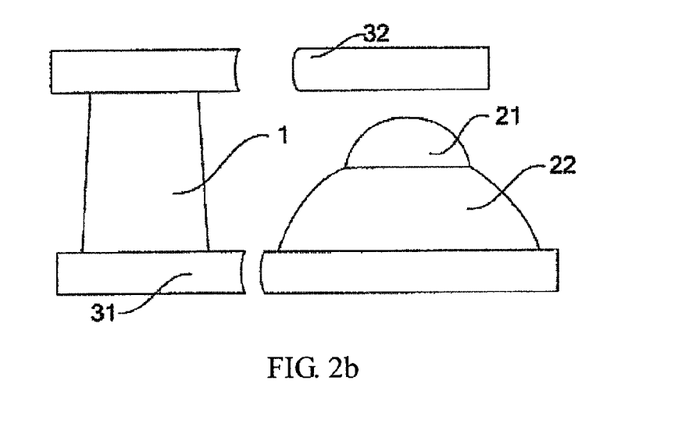
FIG. 2b is another structure schematic view of a main spacer and an assistant spacer in a display panel provided by an embodiment of the invention.

As illustrated in FIG. 2a and FIG. 2b, a display panel provided by the embodiment comprises a first display substrate 31 and a second display substrate 32 arranged to be opposed to each other, and main spacers 1 and assistant spacers 2 arranged between the first display substrate 31 and the second display substrate 32. Both the main spacers 1 and the assistant spacers 2 are arranged on the first display substrate 31, or both the main spacers 1 and the assistant spacers 2 are arranged on the second display substrate 32, and the suspending end of at least one of the assistant spacers 2 is a planar surface, as illustrated in FIG. 2a, and/or the suspending end of at least one of the assistant spacers 2 is a convex surface, as illustrated in FIG. 2b.

In the display panel provided by the embodiment of the invention, the main spacers 1 and the assistant spacers 2 are arranged on the same display substrate, and an end surface of the suspending end of at least one of the assistant spacer 2 is a planar surface, and/or an end surface of the suspending end of at least one of the assistant spacers 2 is a convex surface. In order to facilitate the description, the main spacers 1 and the assistant spacers 2 which are both arranged on the first display substrate 31 are described as an example hereinafter.

Upon the pressure between the first display substrate 31 and the second display substrate 32 of the display panel being too much, the end surfaces of the suspending ends of the assistant spacers 2 support a surface of the second display substrate 32 toward the first display substrate 31. As illustrated in FIG. 2a, upon the end surfaces of the suspending ends of the assistant spacer 2 being a planar surface, the contact area between the end surfaces of the suspending ends of the assistant spacers 2 and the second display substrate 32 can be increased, and the stability of the assistant spacers 2 for supporting is enhanced. As illustrated in FIG. 2b, upon the end surfaces of the suspending ends of the assistant spacers 2 are a convex surface, the end surfaces of the suspending ends of the assistant spacers 2 deform after being subjected to pressure, the contact area between end surfaces of the suspending ends of the assistant spacers 2 and the second display substrate 32 is increased, and accordingly, the stability of the assistant spacers 2 for supporting is enhanced and the product performance is improved.

Consequently, the support stability of the assistant spacers in the display panel provided by the embodiment of the invention is high.

For example, the end surfaces of the suspending ends of the assistant spacers 2 on the first display substrate can all be planar or convex, alternatively, a part of the end surfaces can be planar, and the other part can be convex. The supporting principle thereof would not be described herein.

As the structure illustrated in FIG. 2b, for example, upon the end surfaces of the suspending ends of the assistant spacers 2 are convex, each assistant spacer 2 comprises a main body 22 and a suspending convex part 21, and a surface of the suspending convex part 21 which departs from the main body 22 is a hemispherical surface, that is to say, the assistant spacer 2 has a shape of candleholder. The main body 22 is the base of the candleholder shaped assistant spacer 2, which has a large area, and is capable of enduring a greater force upon supporting the second display substrate 32, and then further enhances the stability of the assistant spacers 2 upon supporting the second display substrate 32.

The distance between the first display substrate 31 and the second display substrate 32 can be referred as a cell thickness, while the height of the main spacers 1 is equal to the cell thickness. The main spacers 1 are mainly used to maintain the distance between the first display substrate 31 and the second display substrate 32. The height of the assistant spacers 2 is smaller than the height of the main spacers 1, and the assistant spacers 2 can act as a supporter only upon the panel bears the extrusion such that the distance between the two display substrates becomes smaller.

For example, the display panel can comprise but not limit to a liquid crystal display panel, an electronic paper or an organic light emitting display panel. When the display panel is a liquid crystal display panel, the first display substrate can be a color filter substrate and the second display substrate can be an array substrate. Alternatively, the first display substrate can be an array substrate and the second display substrate can be a color filter substrate.

Second Embodiment

Figure 3:
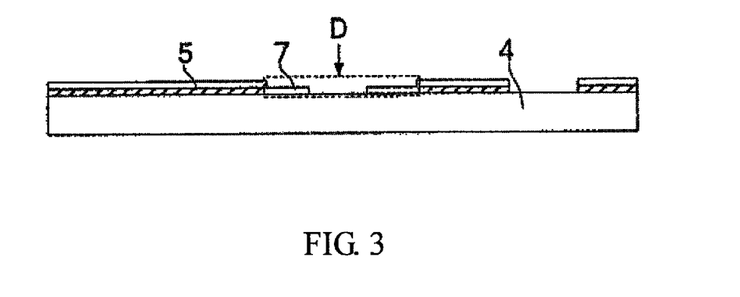
FIG. 3 is a structure schematic view of a half-tone mask provided by a second embodiment of the invention.

As illustrated in FIG. 3, an embodiment of the invention provides a half-tone mask for manufacturing a display panel, comprising a base substrate 4 and a light shielding film 5 on the base substrate 4, wherein the light shielding film 5 has half-tone transparent regions D in a one-to-one correspondence with the assistant spacers 2, a half-tone transparent region D is illustrated in the dashed line frame in FIG. 3 and provided with a half-tone transparent film 7, and a central region of at least one half-tone transparent film 7 is a hollowed-out region. For example, neither the light shielding film 5 nor the half-tone transparent film 7 is provided on the base substrate of the hollowed-out region.

When the half-tone mask provided by the embodiment of the invention is used to manufacture an assistant spacer in a display panel, a central region of a half-tone transparent region D is a hollowed-out region. The interference phenomenon can be reduced while the light passes through the half-tone transparent film 7 during the exposure, such that the central position of the end surface of the suspending end of the assistant spacer is exposed sufficiently during the exposure, the probability for forming recess at the central position of the end surface of the suspending end of the assistant spacer is reduced, and thus the structure of the suspending end of the assistant spacer is improved and the support stability of the assistant spacer is enhanced.

In one example, the above light shielding film is a chrome film. However, the material of the light shielding film is not limited to this, but can be any materials having the light shielding property.

For example, the half-tone transparent region of the half-tone mask correspond to the assistant spacer when it is used, while the half-tone mask can further comprise a transparent region corresponding to a region other than the main spacer and a non-transparent region corresponding to the main spacer and the assistant spacer.

Third Embodiment

The present embodiment provides a manufacturing method of a half-tone mask, comprising:

step S401: forming a light shielding film on a base substrate, and forming an open region for a half-tone transparent region in the light shielding film by one patterning process;

step S402: forming a half-tone transparent film on the base substrate after the above step, and forming a hollowed-out region in a central region of the half-tone transparent region by one patterning process.

Figure 4A:
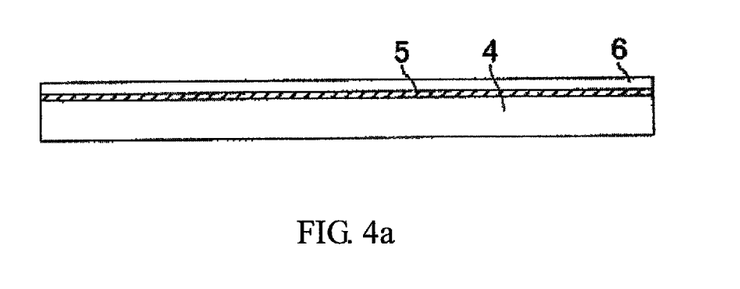
FIGS. 4a to 4i are schematic views of respective steps for manufacturing a half-tone mask in a third embodiment of the invention.
Figure 4B:
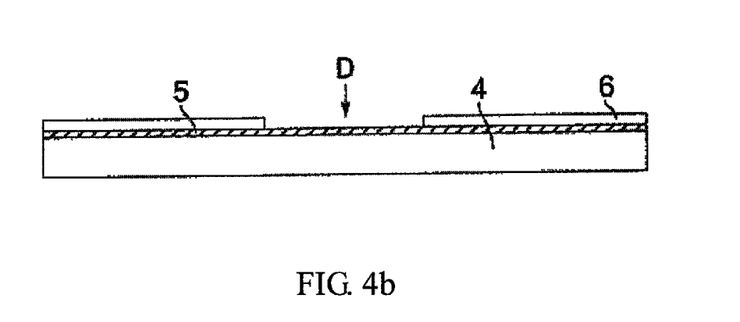
Figure 4C:
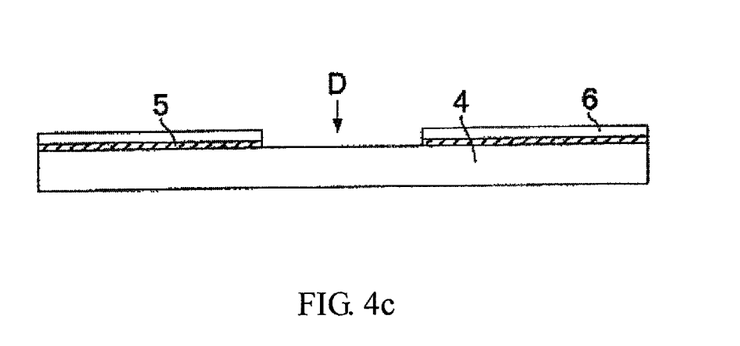
Figure 4D:
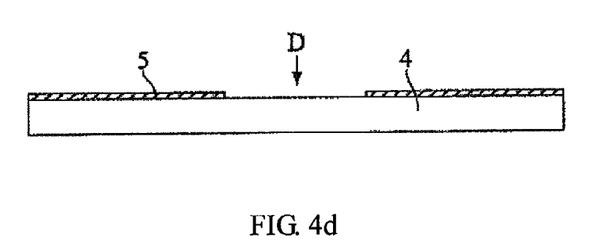

In an example embodiment, the step S401 can comprise:
forming a light shielding film 5 on a base substrate 4, and applying a layer of photoresist 6 on the light shielding film 5;

performing an exposing and developing process, such that the photoresist forms into a photoresist-removed region corresponding to the open region for the half-tone transparent region and a photoresist-retained region corresponding to a region other than the above region; and, after the developing processing, the photoresist of the photoresist-removed region being removed completely while the photoresist of the photoresist-retained region being retained, as illustrated in FIG. 4b;

performing an etching process to etch off the light shielding film of the photoresist-removed region, that is to say, to etch and remove a part of the region of the light shielding film 5 corresponding to the half-tone transparent region D of the half-tone mask, as illustrated in FIG. 4c;

removing a residual photoresist, as illustrated in FIG. 4d.

Figure 4E:
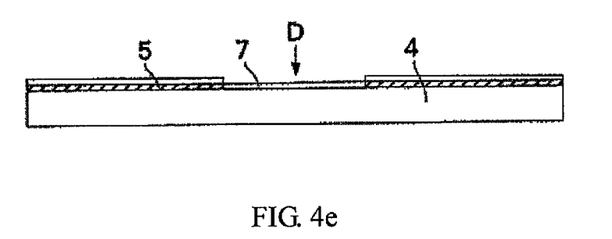
Figure 4F:
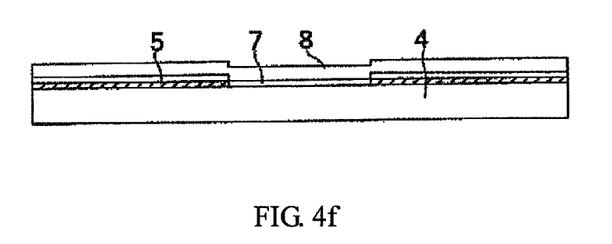
Figure 4G:
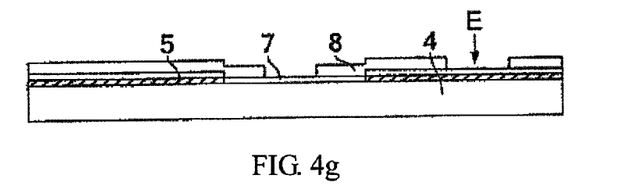
Figure 4H:
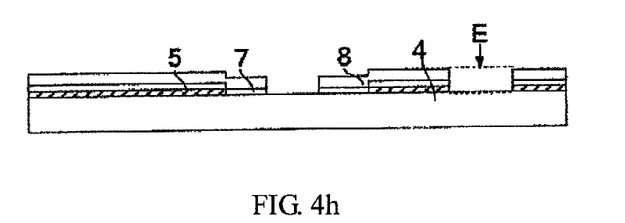
Figure 4I:
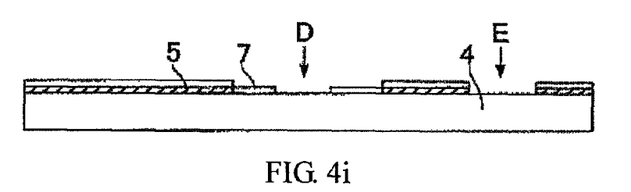

In an example embodiment, the step S402 can comprise:
forming a half-tone transparent film 7 on the base substrate after the step S401, as illustrated in FIG. 4e, for example, the half-tone transparent film 7 can be formed by depositing, coating and sputtering processes, and etc., which will not be repeated herein;

applying a layer of photoresist 8 on the half-tone transparent film 7, as illustrated in FIG. 4f;

performing a second exposing and developing process, such that the photoresist forms into a photoresist-removed region and a photoresist-retained region, and the photoresist of the photoresist-removed region is removed; wherein the photoresist-removed region corresponds to a central region of the half-tone transparent region and the photoresist-retained region corresponds to the region other than the central region of the half-tone transparent region and a non-transparent region, such that the central region of the half-tone transparent region D is exposed; and optionally, in order to save the manufacturing procedures of the half-tone mask, a part of the region E of the light shielding film 5 corresponding to the main spacer can also be exposed in this step, as illustrated in FIG. 4g;

performing an etching process to etch off the half-tone transparent film of the photoresist-removed region, that is to say, to etch the half-tone transparent film of the central region of the half-tone transparent region D; optionally, in order to save the manufacturing procedures of the half-tone mask, a part of the region E of the light shielding film 5 corresponding to the main spacer can also be etched, with the region E of the light shielding film 5 corresponding to the main spacer being the region as illustrated in the dashed line frame in FIG. 4h;

removing the residual photoresist finally, as illustrated in FIG. 4*i*.

The half-tone mask provided in the second embodiment can be manufactured by the above step S401 and step S402.

Fourth Embodiment

The present embodiment provides a further manufacturing method of the half-tone mask provided by the second embodiment, comprising:

step S601: forming a light shielding film on a base substrate, and forming a region of a half-tone transparent region, which has the light shielding film retained in a central region, in the light shielding film by one patterning process;

step S602: forming a half-tone transparent film on the base substrate after the step S601, and removing the half-tone transparent film of the central region and the retained light shielding film by one patterning process, such that the central region with the light is formed into a hollowed-out region in the central region of the half-tone transparent region.

Figure 5A:
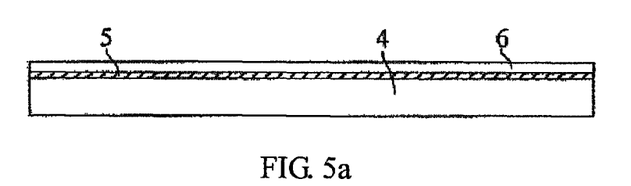
FIGS. 5a to 5i are schematic views of respective steps for manufacturing a half-tone mask in a fourth embodiment of the invention.
Figure 5B:
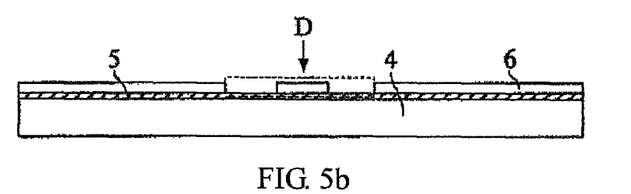
Figure 5C:
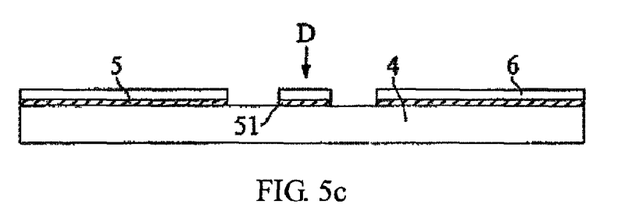
Figure 5D:
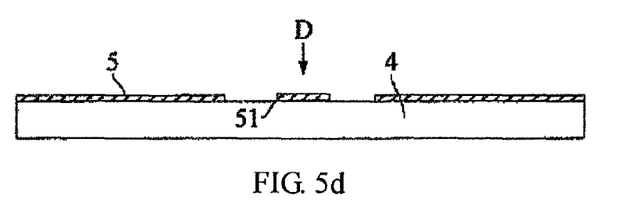

The step S601 can concretely comprises:

forming a light shielding film 5 on a base substrate 4, and applying a layer of photoresist 6 on the light shielding film 5, as illustrated in FIG. 5*a*;

performing a first exposing and developing process on the photoresist 6 on the light shielding film 5, such that the photoresist within the position corresponding to a half-tone transparent region D of a half-tone mask other than the photoresist at the position corresponding to a central region of the half-tone transparent region D in the light shielding film 5 is removed, as illustrated in FIG. 5*b*;

performing an etching process for a part of the light shielding film 5 without photoresist 6 coated thereon, such that a light shielding pattern is formed, wherein the central region of the half-tone transparent region D of the half-tone mask has the light shielding film 51 retained, as illustrated in FIG. 5*c*;

removing the residual photoresist, as illustrated in FIG. 5*d*.

Figure 5E:
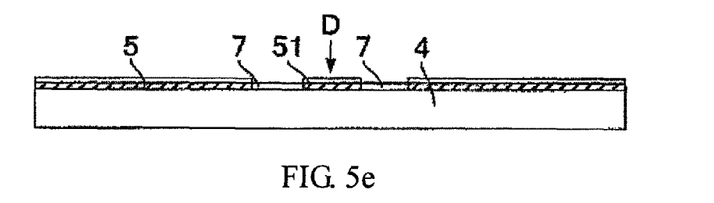
Figure 5F:
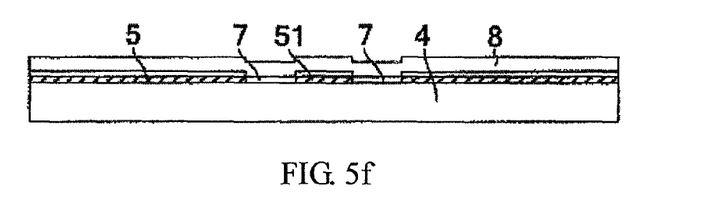
Figure 5G:
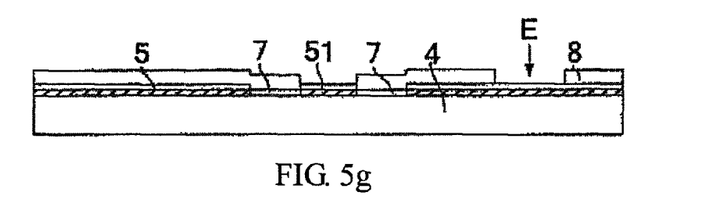
Figure 5H:
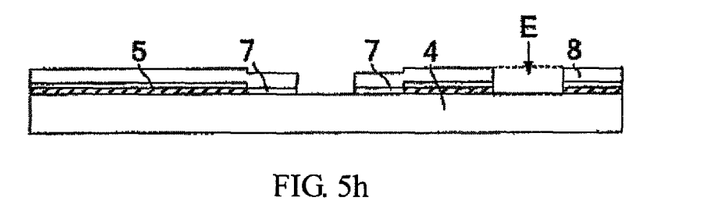
Figure 5I:
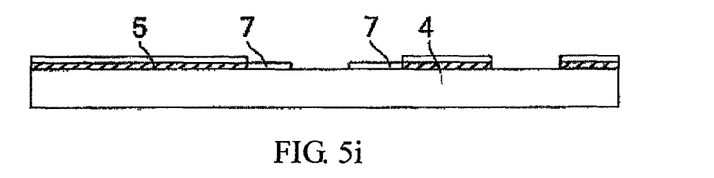

The step S602 can concretely comprises:

forming a layer of a half-tone transparent film 7 on the base substrate after the step S601, as illustrated in FIG. 5*e*, for example, the half-tone transparent film 7 can be formed by depositing, coating and sputtering processes, etc., which will not be repeated herein;

then applying a layer of photoresist 8 on the half-tone transparent film 7, as illustrated in FIG. 5*f*;

performing a second exposing and developing process, such that the photoresist forms into a photoresist-removed region and a photoresist-retained region, and the photoresist of the photoresist-removed region is removed; wherein the photoresist-removed region corresponds to a region of the half-tone transparent region with the light shielding film retained in a central region, and the photoresist-retained region corresponds to the region other than the central region of the half-tone transparent region and a non-transparent region; and optionally, in order to save the manufacturing procedures of the half-tone mask, the light shielding film 5 in the region E of the half-tone mask corresponding to the main spacer can also be exposed in this step, as illustrated in FIG. 5*g*;

performing an etching process to etch off the half-tone transparent film of the region (the half-tone transparent film of the central region of the half-tone transparent region), that is to say, to etch the light shielding film 5 without photoresist 8 coated thereon, and forming a half-tone transparent layer pattern and a light shielding layer pattern, as illustrated in FIG. 5*h*;

removing the residual photoresist finally, as illustrated in FIG. 5*i*.

The half-tone mask provided in the second embodiment can also be manufactured by the above step S601 and step S602.

By synthesizing the above third embodiment and fourth embodiment, the above forming of the light shielding film and the patterning process can be as follows: forming a light shielding film on a base substrate and performing one patterning process on the above light shielding film to define a non-transparent region and a half-tone transparent region, wherein the light shielding film of the non-transparent region is retained and at least the light shielding film other than a central region in the half-tone transparent region is removed. After forming the half-tone transparent film, a hollowed-out region can be formed in the central region of the half-tone transparent region by one patterning process. Here, the difference between the third embodiment and the fourth embodiment lies in that the third embodiment is only required to remove the half-tone transparent film of the central region of the half-tone transparent region, while the fourth embodiment is required to remove the half-tone transparent film and retained light shielding film of the central region of the half-tone transparent region. In addition, in the above third embodiment and fourth embodiment, the half-tone transparent region corresponds to the assistant spacer, the transparent region corresponds to the main spacer and the retained non-transparent region corresponds to the region other than the main spacer and the assistant spacer.

As for the material for forming the spacer, for example, a negative photoresist material can be used, such that the exposed part is retained in the resultant spacer.

Fifth Embodiment

Figure 6:
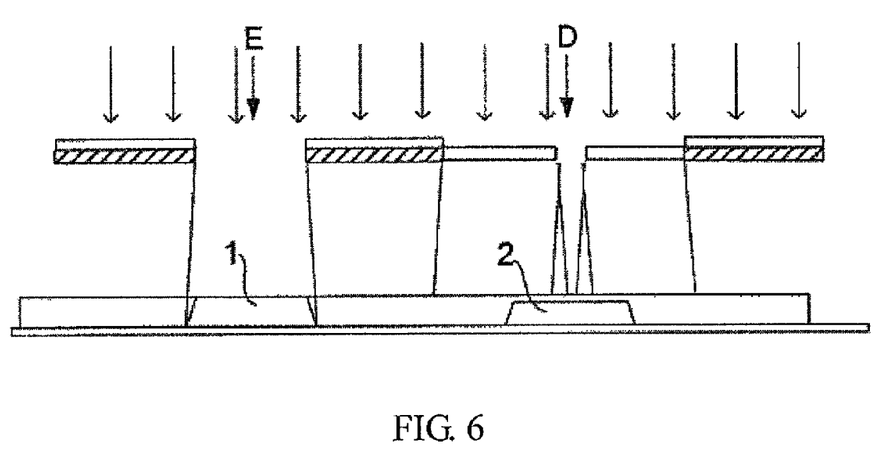
FIG. 6 is a structure schematic view for manufacturing a main spacer and an assistant spacer in a fifth embodiment of the invention.

The present embodiment provides a manufacturing method of a display panel provided in the first embodiment and preferred embodiment thereof. As illustrated in FIG. 6, an assistant spacer is manufactured by employing the half-tone mask provided in the second embodiment.

The central region of the half-tone transparent region of the half-tone mask is a hollowed-out region. The interference phenomenon can be reduced in the central part while the light passes through the half-tone transparent film during the exposure, such that the central position of the end surface of the suspending end of the assistant spacer 2 is exposed sufficiently during the exposure, the probability of occurrence of the recess forming at the central position of the end surface of the suspending end of the assistant spacer is reduced, and thus the structure of the suspending end of the assistant spacer is improved and the support stability of the assistant spacer is enhanced. The main spacer 1 and the assistant spacer 2 are formed by one patterning process.

By means of the half-tone mask of the embodiment of the invention, the end surface of the manufactured spacer can be planar or convex. For example, the planar surface or the convex surface can be formed depending on the revolution of the exposure apparatus, the sensitivity of the material and the exposure process. In a word, manufacturing the assistant spacer by means of the embodiment of the invention reduces the probability of occurrence of the recess forming at the central position of the end surface of the suspending end of the assistant spacer.

Sixth Embodiment

The present embodiment provides a display device comprising the above display panel. The display device can be a liquid crystal panel, an electronic paper, an OLED panel, a mobile telephone, a tablet computer, a television, a display, a notebook computer, a digital photo frame, a navigator and any other products and parts having the display function. Due to the high supporting stability of the assistant spacer in the above display panel, the pressure-resistant capacity of this display device is high and the performance of the product is good.

The above are only the example embodiments of the invention, and are not intended to limit the protection scope of the invention. The protection scope of the invention is determined by the appending claims.

What is claimed is:

1. A half-tone mask comprising non-transparent regions and half-tone transparent regions, wherein the non-transparent regions are provided with a light shielding film, the half-tone transparent regions are provided with a half-tone transparent film, a central region of the half-tone transparent film in at least one of the half-tone transparent regions is a hollowed-out region on which neither the light shielding film nor the half-tone transparent film is provided, to expose assistant spacers of a display substrate, the central region of the half-stone transparent film is surrounded by the half-tone transparent region and is located at a center of the half-tone transparent region, and the half-tone mask further comprises a transparent region without light shielding film and half-tone transparent film provided therein to expose main spacers of the display substrate.

2. The half-tone mask according to claim 1, wherein the light shielding film is a chrome film.

3. The half-tone mask according to any claim 1, further comprising a transparent base substrate, wherein the light shielding film and the half-tone transparent film are provided on the base substrate.

4. A manufacturing method of a half-tone mask, comprising:
    forming a light shielding film on a base substrate, and performing a patterning process on the light shielding film to define a non-transparent region and a half-tone transparent region, wherein the light shielding film in the non-transparent region is retained and at least a part of the light shielding film other than a central region in the half-tone transparent region is removed, wherein the central region of the half-tone transparent region is surrounded by the half-tone transparent region and is located at a center of the half-tone transparent region;
    forming a half-tone transparent film on the base substrate after the above step, and forming a hollowed-out region in the central region of the half-tone transparent region to expose assistant spacers of a display substrate and a transparent region to expose main spacers of the display substrate by a patterning process.

5. The manufacturing method according to claim 4, wherein the light shielding film of the half-tone transparent region is completely removed in the patterning process on the light shielding film; forming the half-tone transparent film on the base substrate after the above step, and forming the hollowed-out region in the central region of the half-tone transparent region by the patterning process comprises:
    forming the half-tone transparent film on the base substrate;
    applying a layer of photoresist on the half-tone transparent film;
    performing an exposing and developing process such that the photoresist forms into a photoresist-removed region corresponding to the central region of the half-tone transparent region and a photoresist-retained region corresponding to the region other than the central region of the half-tone transparent region and the non-transparent region;
    etching the half-tone transparent film of the central region of the half-tone transparent region;
    removing the residual photoresist.

6. The manufacturing method according to claim 4, wherein the light shielding film of the central region of the half-tone transparent region is retained in the patterning process on the light shielding film; forming the half-tone transparent film on the base substrate after the above step, and forming the hollowed-out region in the central region of the half-tone transparent region by the patterning process comprises:
    forming the half-tone transparent film on the base substrate;
    applying a layer of photoresist on the half-tone transparent film;
    performing an exposing and developing process such that the photoresist forms into a photoresist-removed region corresponding to the central region of the half-tone transparent region with the light shielding film retained and a photoresist-retained region corresponding to the region other than the central region of the half-tone transparent region and the non-transparent region;
    etching the light shielding film and the half-tone transparent film in the region being not covered with photoresist, and forming a pattern of the half-tone transparent film and a pattern of the light shielding film;
    removing the residual photoresist.

7. The manufacturing method according to claim 5, wherein the photoresist-removed region further corresponds to the transparent region, and the half-tone transparent film and the light shielding film of the transparent region are etched off.

8. The half-tone mask according to claim 2, further comprising a transparent base substrate, wherein the light shielding film and the half-tone transparent film are provided on the base substrate.

9. The manufacturing method according to claim 6, wherein the photoresist-removed region further corresponds to the transparent region, and the half-tone transparent film and the light shielding film of the transparent region are etched off.

* * * * *